May 5, 1970 R. G. MANKARIOUS ET AL 3,510,734

IMPATT DIODE

Filed Oct. 18, 1967

INVENTORS
RAMZY G. MANKARIOUS,
DAVID L. ENGLISH,
BY
William Allen Jr
ATTORNEY.

3,510,734

IMPATT DIODE

Ramzy G. Mankarious, Costa Mesa, and David L. English, Garden Grove, Calif., assignors to Hughes Aircraft Company, Culver City, Calif., a corporation of Delaware Filed Oct. 18, 1967, Ser. No. 676,196
Int. Cl. H01l 1/12, 1/14
U.S. Cl. 317—234 9 Claims

ABSTRACT OF THE DISCLOSURE

A high-frequency power diode, employing, respectively, thick (50 microns) silver pads as heat sink means at both contact surfaces, dissipates heat from the junction at high operating temperatures and yet retains mechanical strength and stability for high power applications.

This invention relates to high-frequency power diodes capable of operating in avalanche mode, commonly known as IMPATT diodes (IMPact Avalanche and Transit Time). More particularly, the invention relates to such diodes employing a heat sink means integral therewith. The device of the invention is especially useful as a high power microwave diode, for use in high-frequency transmission lines such as a waveguide or in a microstrip circuit or in a package housing the device solely.

High-frequency power diodes of the type to which the present invention appertains are known to those skilled in the art and are discussed by DeLoach in the Microwave Journal of July 1966, in an article entitled, "Microwave Solid State Sources."

Of existing types of semiconductor devices capable of generating appreciable microwave power, IMPATT diodes are reported to have an advantage in high-power, high-frequency achievement over other microwave power diodes. The referenced article, for example, indicates that the attainable power from solid state microwave devices falls off with frequency. For devices limited by avalanche breakdown, as is an IMPATT diode, the power output falls off approximately as $1/f^2$ in comparison with other devices such as tunnel diodes and Gunn oscillators whose power falls off approximately as $1/f^{2.5}$.

This power-frequency relationship places emphasis on maximum carrier velocities in solids and maximum attainable voltage, which combined gives the maximum rate at which energy can be delivered to carriers within a device. It follows that heat removal, surface breakdown, uniformity of materials and many other problems are also operational factors.

Heretofore, ohmic contacts for diodes have been made by alloying or soldering the semiconductor substrate in which the diode is formed to molybdenum discs; these in turn have been soldered to package studs. It has been customary to provide ohmic contact to the opposite side of the p-n junction by bonding a fine wire or ribbon directly to the small junction area, or by alloying this small junction area to high thermally conductive members. With these arrangements, heat generated in the junction could be removed either by conduction through the high thermal resistance of the silicon substrate or through high thermal barriers formed by the resultant alloys.

It is therefore an object of the present invention to provide an improved high-frequency diode.

Another object of the invention is to provide a high-frequency power diode which is characterized by improved capability for heat dissipation.

A further object of the invention is to provide a high-frequency power diode for improved configuration: having a junction-forming surface and near-surface region of an epitaxially formed layer with a high P-type conductivity, on a semiconductor substrate having a high N-type conductivity; and having a front metallic contact layer upon the surface and near-surface region of the epitaxially formed layer with a high P-type conductivity, and a back metallic contact layer upon the back surface of the substrate, both contact layers being contiguous to, or touching, a heat sink means comprising a thick silver pad.

Still another object of the invention is to provide improved methods of fabrication of high-frequency power diodes.

These and other objects and advantages of the invention are realized in a diode structure by employing in one embodiment, for example, a gold metallic contact layer applied to the portion of an epitaxial silicon layer in which a conductivity-type-determining impurity is incorporated, which epitaxial layer is disposed on a silicon substrate with the novel inclusion of a pad of elemental silver electroplated upon the surface of the front metallic contact layer and upon the back metallic contact layer on the back surface of the structure. It is to be understood that besides gold, nickel may be used for the metallic contact material. The contact metal may also be selected from chromium, molybdenum, or titanium; however, if any of these latter three metals is used a layer of gold should be provided over such metal contacts in order to achieve good electrical contact to the silver pad to be mounted thereupon. It is to be further understood that the impurity (e.g., boron) may be incorporated into the epitaxial layer either by diffusion or by the implantation of boron ions in the epitaxial layer.

In the device of the invention, novelty resides at least in part in an improved structure employing a heat sink means integral therewith, contact to which heat sink means is uniform throughout, permitting heat transfer to be uniform over the surface of the contacts. The uniform temperature thus achieved furthers diode longevity and the reduction of noise.

Ohmic contact is made by means of two thick, elemental silver pads, which have higher thermal conductivity than alloys used heretofore. Further, because of the absence of alloys in the structure of the device which could alloy into silicon through the junction and cause short circuits, improved operation at higher temperatures is afforded.

Fabrication of the device and the performance characteristics thereof will be described in detail hereinafter, in connection with a description of the structure of the device in a preferred embodiment thereof.

The invention will be described in greater detail by reference to the drawings in which.

Figure 1:
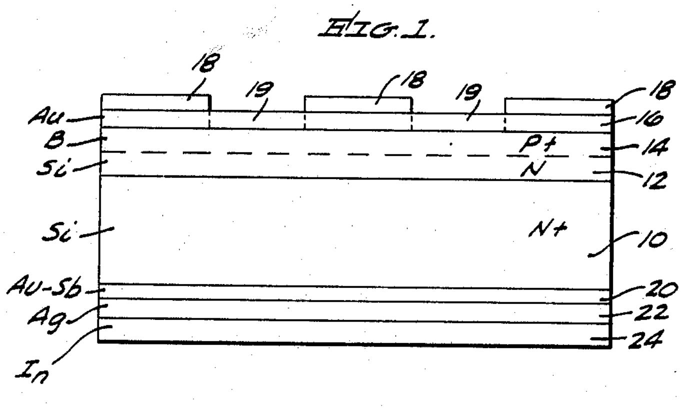
FIG. 1 is a schematic representation in end view of a plurality of diodes formed on a single semiconductor substrate, or wafer, subsequently to be diced to obtain discrete diodes according to the invention, and indicates the composition thereof.
Figure 2:
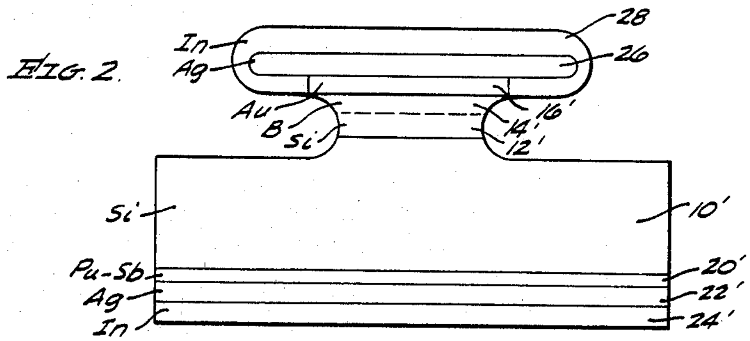
FIG. 2 is a schematic representation in end view of the invention after a mesa configuration has been formed and heat sink means have been applied at the junction.

Referring now to FIG. 1, a preferred embodiment of the device of the invention is illustrated in terms of its composition. Actually, as shown in FIG. 1, a large number of diodes are fabricated simultaneously on a silicon wafer which is subsequently diced up to form discrete diode devices as shown in FIG. 2. A heavily doped silicon semi-conductor substrate 10 having a high N-type conductivity is a base for an epitaxially-formed layer 12 of silicon lightly doped and providing a somewhat less high N-type conductivity than that of the substrate 10. A region 14 having a high P-type conductivity, formed by diffusion of boron into the epitaxially-formed layer 12, supports a front metallic contact layer 16, for example, gold, on the surface thereof. (Oxide layers formed and/or used in the diffusion process are removed after the diffusion operation.) Photoresist masks 18 permit the etching out of parts of the front metallic contact layer 16 to expose parts of the region 14 between the remaining gold contact areas.

After etching out parts 19 of the front metallic contact layer 16, masks 18 are chemically removed, leaving in situ gold contacts 16 which may be about 10 mils in diameter, for example. A back metallic contact layer 20 of gold-antimony is provided as ohmic contact on the back surface of the substrate 10, backed by heat sink means comprising a silver pad 22 having a plated indium layer 24 thereupon. Layer 20 is applied after the application of region 14 abovedescribed.

Referring now to FIG. 2, the front metallic or gold contact layer 16' is shown for convenience as a solid layer. Upon the front metallic contact layer 16' is electroplated a thick silver pad 26 as heat sink means which in turn is covered by a plated indium layer 28, as is also the case with respect to the silver pad 22' on the back metallic contact which has a plated indium layer 24'. The sides of the epitaxially formed layer 12' and the region 14' and the top of the substrate 10 have been etched away after the plating of the silver pad 26 to form a mesa configuration as indicated. The indium layers 24' and 28 are included to enhance the contact between silver and the assembly in which the diode is to reside. It is to be noted that silver does not adhere to, or plate, the exposed silicon in the interstices between the gold contacts because of the differences in potential during the plating operation. It is further to be noted that the "mushroom" shape of the silver pad 26 is so designed in order that the overhang of the heat sink means will function uniformly over all areas of activity, at the periphery of the mesa as well as on the surface thereof.

Figure 3:
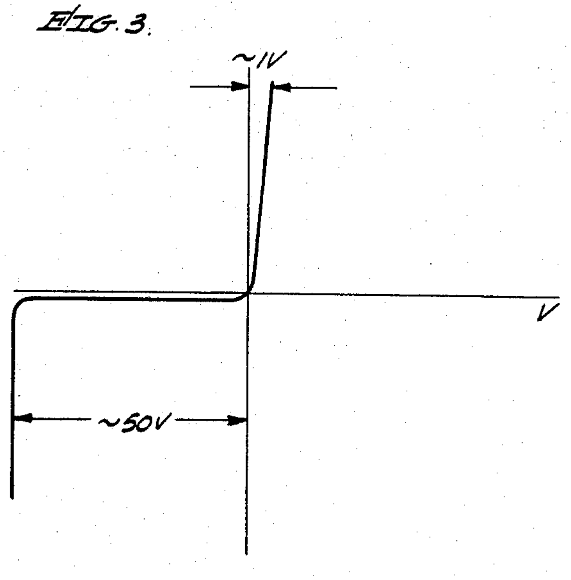
FIG. 3 is a graphical representation showing a curve representing current-versus-voltage characteristics of the diode of the invention.

Referring now to FIG. 3, the relationship between current and voltage is plotted during operation of a high-frequency power diode. It is seen that for a given current level, as the diode operates in the forward direction, the power to be dissipated amounts to approximately 1 volt times the current $I_x$. As the diode is biased in the avalanche mode, the power now to be dissipated at a current level $I_x$ is approximately fifty times that of the power in the forward direction, because of the high avalanche voltage (e.g., 50 volts). There thus is seen to be a specific need for heat sink means such as that which the device of the invention provides. In practice, diodes processed with the mesa configuration illustrated have been found to be capable of dissipating 30 watts of applied DC power (250,000 watts/cm.$^2$), yet retaining mechanical strength and stability.

It is to be understood that other materials may be acceptable in the fabrication of the device of the invention, as abovementioned, and that other dimensions may be acceptable; but the preferred embodiment illustrated and described herewith in FIGS. 1 and 2 is conceived with the dimensions as shown in tabular form below:

| Layer | Reference numeral | Thickness |
|---|---|---|
| Substrate silicon | 10 | 100 microns. |
| Epitaxial silicon | 12 | 5 microns. |
| Diffused boron | 14 | 0.5–3 microns. |
| Evaporated gold | 16 | 500 angstroms. |
| Plated silver pad | 22 and 26 | 50 microns. |
| Plated indium | 24 and 28 | 12 microns. |

There has thus been described an improved high-frequency power diode with heat sink capability useful in high power operations.

What is claimed is:

1. A high-frequency power diode of mesa configuration comprising:

(a) a semiconductor substrate having a high N-type conductivity;

(b) an N-type semiconductor layer epitaxially-formed upon said substrate and of lower conductivity than that of said substrate;

(c) said epitaxially-formed layer having surface and near-surface portions of high P-type conductivity;

(d) a front metallic contact layer upon the surface of said epitaxially-formed layer;

(e) a back metallic contact layer upon the back surface of said substrate; and (f) discrete mushroom shaped heat sink means contiguous to the surface of said front metallic contact layer.

2. The invention according to claim 1 wherein said substrate and said epitaxially-formed layer are silicon (Si).

3. The invention according to claim 1 wherein said surface and near-surface region is formed by diffusing boron (B) therein.

4. The invention according to claim 1 wherein the metal for said front metallic contact layer is selected from the group consisting of gold, chromium, molybdenum and nickel.

5. The invention according to claim 1 wherein the metal for said front metallic contact layer is selected from the group consisting of chromium-gold or nickel-gold.

6. The invention according to claim 1 wherein said heat sink means on said front metallic contact layer comprises a pad of electroplated elemental silver.

7. The invention according to claim 1 wherein said heat sink means on said front metallic contact layer comprises a pad of electroplated elemental silver covered with an electroplated layer of indium.

8. The invention according to claim 1 wherein said back metallic contact layer is gold-antimony (Au-Sb), contiguous to said substrate and backed by a silver pad covered with a plated layer of indium.

9. The invention according to claim 8 wherein the thickness of said substrate is about 100 microns; of said epitaxially-formed layer about 5 microns; of said surface and near-surface portion about 0.5–3 microns; of said front metallic contact layer about 500 angstroms; of said back metallic contact layer on the back surface of said substrate about 1000 angstroms; of said silver pads about 50 microns; and of said plated indium layers about 12 microns.

References Cited

UNITED STATES PATENTS

| | | | |
|---|---|---|---|
| 3,290,565 | 12/1966 | Hastings | 317—234 |
| 3,307,079 | 2/1967 | Eisenhower et al. | 317—101 |
| 3,337,779 | 8/1967 | Bowman et al. | 317—234 |
| 3,381,185 | 4/1968 | Whitman et al. | 317—234 |
| 3,430,335 | 3/1969 | Gee | 29—588 |
| 3,457,471 | 7/1969 | Moroney et al. | 317—234 |

JOHN W. HUCKERT, Primary Examiner

R. F. POLISSACK, Assistant Examiner

U.S. Cl. X.R.

317—235